(12) United States Patent
Nagai et al.

(10) Patent No.: US 7,859,002 B2
(45) Date of Patent: Dec. 28, 2010

(54) LIGHT-EMITTING DEVICE

(75) Inventors: Hideo Nagai, Osaka (JP); Masa-aki Suzuki, Osaka (JP); Tadaaki Ikeda, Kagoshima (JP)

(73) Assignee: Panasonic Corporation, Osaka (JP)

( * ) Notice: Subject to any disclaimer, the term of this patent is extended or adjusted under 35 U.S.C. 154(b) by 238 days.

(21) Appl. No.: 12/303,458

(22) PCT Filed: Aug. 6, 2007

(86) PCT No.: PCT/JP2007/065872

§ 371 (c)(1),
(2), (4) Date: Dec. 4, 2008

(87) PCT Pub. No.: WO2008/018615

PCT Pub. Date: Feb. 14, 2008

(65) Prior Publication Data

US 2009/0302338 A1 Dec. 10, 2009

(30) Foreign Application Priority Data

Aug. 9, 2006 (JP) ............................. 2006-217058

(51) Int. Cl.
*H01L 33/00* (2010.01)
(52) U.S. Cl. ........... 257/98; 257/E33.067; 257/E33.059
(58) Field of Classification Search .................. 257/98, 257/99, 100, E33.067, E33.059
See application file for complete search history.

(56) References Cited

U.S. PATENT DOCUMENTS

| 6,717,362 | B1 | | 4/2004 | Lee et al. | |
|---|---|---|---|---|---|
| 7,646,034 | B2 | * | 1/2010 | Ho et al. | ........................ 257/98 |
| 7,655,486 | B2 | * | 2/2010 | Thompson et al. | ............ 438/25 |
| 7,759,691 | B2 | * | 7/2010 | Chang | ........................ 257/100 |
| 2004/0037076 | A1 | | 2/2004 | Katoh et al. | |
| 2004/0061120 | A1 | | 4/2004 | Mizuyoshi | |
| 2004/0184280 | A1 | | 9/2004 | Ishida et al. | |
| 2004/0251469 | A1 | | 12/2004 | Yatsuda et al. | |
| 2004/0256628 | A1 | | 12/2004 | Chin et al. | |
| 2005/0127378 | A1 | | 6/2005 | Suchiro et al. | |
| 2005/0146879 | A1 | | 7/2005 | Takahashi et al. | |

(Continued)

FOREIGN PATENT DOCUMENTS

EP 1 538 682 6/2005

(Continued)

*Primary Examiner*—Thomas L Dickey
*Assistant Examiner*—Fazli Erdem
(74) *Attorney, Agent, or Firm*—Hamre, Schumann, Mueller & Larson, P.C.

(57) ABSTRACT

A light-emitting device (1) having a base (10) and a light-emitting element (11) placed on the base (10) includes a first sealing material layer (12) covering the light-emitting element (11) and a second sealing material layer (13) surrounding a side surface of the first sealing material layer (12), wherein the refractive index of the first sealing material layer (12) and the refractive index of the second sealing material layer (13) are different from each other. The light-emitting device (1) is capable of controlling a radiation pattern from the light-emitting element (11) by controlling the refractive index of the first sealing material layer (12) and the refractive index of the second sealing material layer (13). This can facilitate the miniaturization and reduction in thickness of the light-emitting device (1), and prevent the decrease in a light output efficiency of the light-emitting device (1).

14 Claims, 16 Drawing Sheets

U.S. PATENT DOCUMENTS

| | | |
|---|---|---|
| 2005/0173721 A1 | 8/2005 | Isoda |
| 2005/0189539 A1 | 9/2005 | Furukawa et al. |
| 2007/0182323 A1 | 8/2007 | Ogata et al. |

FOREIGN PATENT DOCUMENTS

| | | |
|---|---|---|
| JP | 8-83869 | 3/1996 |
| JP | 2004-104077 | 4/2004 |
| JP | 2005-5193 | 1/2005 |
| JP | 2005-19987 | 1/2005 |
| WO | 2006/006544 | 1/2006 |

\* cited by examiner

LIGHT-EMITTING DEVICE

TECHNICAL FIELD

The present invention relates to a light-emitting device in which a light-emitting element is covered with a sealing material layer.

BACKGROUND ART

Light-emitting elements such as a light-emitting diode (hereinafter, referred to as a "LED") and a semiconductor laser are used in various kinds of light-emitting devices. Among them, the LED may replace an existing light source that uses discharge and radiation, due to the recently increased luminous flux, as well as the smaller size and higher efficiency compared with those of the existing light source. Furthermore, the LED is smaller in size compared with the light source using discharge and radiation, so that the LED has advantages in the applicability to increased applications, the ease of handling, the expectation of various designs, and the like. Thus, the LED is a light source having increased added values.

Furthermore, the LED is capable of controlling the radiation pattern of emitted light, in combination with an optical system having a reflection function and a lens function. Furthermore, if a LED chip measuring several mm per side is used, the chip can be considered as a small point light source, so that the optical system also can be miniaturized.

The radiation pattern from an LED chip mounted on a flat plane generally exhibits a wide-angle radiation pattern called Lambertian that is substantially symmetrical with respect to an optical axis. In order to control a radiation pattern, a reflection member having a reflection function may be placed on the periphery of the LED chip, and a convex lens having a lens function may be placed above the LED chip (see JP 2004-104077 A). Alternatively, examples of controlling a radiation pattern with a diffraction grating (see JP 2005-19987 A) and controlling a radiation pattern with a shielding member covering a part of the LED chip (see JP 2005-5193 A) also are proposed.

However, in the example disclosed by JP 2004-104077 A, due to the use of a convex lens, the miniaturization and reduction in thickness of a light-emitting device may be difficult. Furthermore, in the example disclosed by JP 2005-19987 A, due to the use of a diffraction phenomenon, high-order diffracted light other than 1st-order diffracted light is not used, so that the light output efficiency of the light-emitting device may decrease. Furthermore, in the example disclosed by JP 2005-5193 A, since a part of light emitted from an LED chip is blocked with a shielding member, the light output efficiency of a light-emitting device may decrease.

DISCLOSURE OF INVENTION

The present invention solves the above-mentioned conventional problem, and its objects is to provide a light-emitting device that can be miniaturized and reduced in thickness easily and can prevent the decrease in a light output efficiency thereof.

A light-emitting device of the present invention having a base and a light-emitting element placed on the base includes a first sealing material layer covering the light-emitting element and a second sealing material layer surrounding a side surface of the first sealing material layer, wherein a refractive index of the first sealing material layer is different from that of the second sealing material layer.

In the light-emitting device of the present invention, the radiation pattern from a light-emitting element can be controlled by controlling each refractive index of a plurality of sealing material layers. Thus, unlike the conventional example, the light-emitting device of the present invention does not require a convex lens, a diffraction grating, a shielding member, or the like, so that the light-emitting device can be miniaturized and reduced in thickness easily and can prevent the decrease in a light output efficiency thereof.

DESCRIPTION OF THE INVENTION

Figure 1:
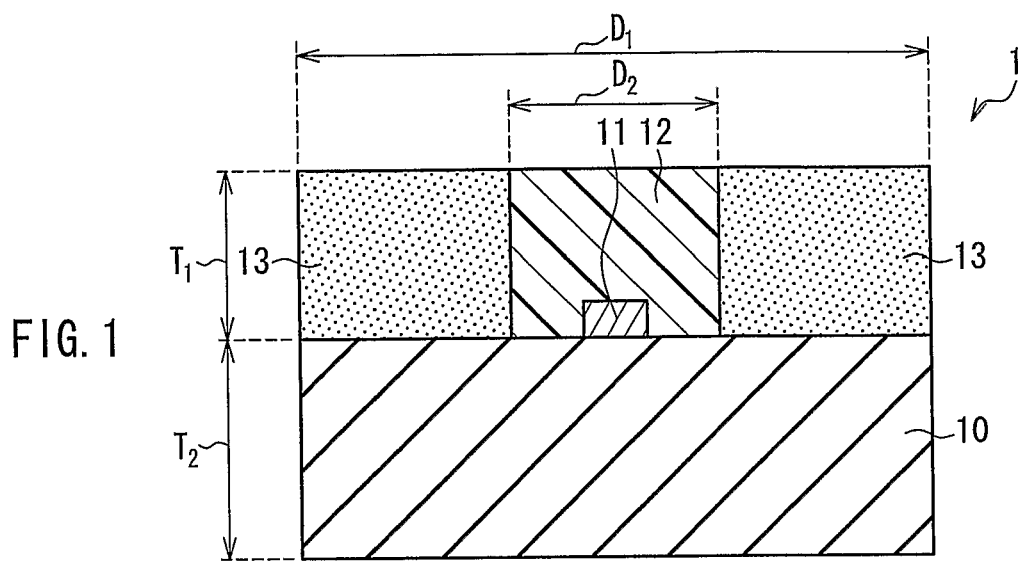
FIG. 1 is a schematic cross-sectional view of a light-emitting device of Embodiment 1 according to the present invention.

A light-emitting device of the present invention includes a base, and a light-emitting element placed on the base. The light-emitting element is mounted on the base, for example, by flip chip bonding or wire bonding.

There is no particular limit to a constituent material for the base, and single crystal such as sapphire, Si, GaN, AlN, ZnO, SiC, BN, or ZnS; ceramic such as $Al_2O_3$, AlN, BN, MgO, ZnO, SiC, C, etc., or a mixture thereof; metal such as Al, Cu, Fe, Au, W, or an alloy containing any of the metals; resin such as epoxy; a composite material containing an inorganic filler and resin; glass; quartz; or the like can be used. As the resin and glass, for example, those listed as materials constituting a sealing material layer (described later) can be used.

As the light-emitting element, for example, a red LED emitting red light having a wavelength of 600 to 660 nm, a yellow LED emitting yellow light having a wavelength of 550 to 600 nm, a green LED emitting green light having a wavelength of 500 to 550 nm, a blue LED emitting blue light having a wavelength of 420 to 500 nm, a blue-violet LED emitting blue-violet light having a wavelength of 380 to 420 nm, or the like can be used. Furthermore, a LED combined with a wavelength converting material may be used, such as a white LED emitting white light with a blue LED and a yellow phosphor, for example, and a white LED emitting white light with a blue-violet LED or an ultraviolet LED and blue, green and red phosphors, for example. Even in an LED emitting infrared light (780 nm to 2 μm) and an LED emitting ultraviolet light in a range of 380 to 200 nm, in addition to a visible light range of 380 to 780 nm, the radiation pattern can be controlled by the present invention. As the above-mentioned red LED and the above-mentioned yellow LED, for example, a LED using an AlInGaP-based material can be used. Furthermore, as the above-mentioned green LED, the above-mentioned blue LED, the above-mentioned blue-violet LED, and the above-mentioned ultraviolet LED, for example, a LED using an InGaAlN-based material can be used. As red to infrared light, a LED using an AlGaAs-based material and an InGaAsP-based material can be used. The ratio of a combination of elements for a LED material in the light-emitting element in each system formed by epitaxial growth is adjusted appropriately in accordance with an emission wavelength. The number of light-emitting elements placed on the base is not particularly limited, and may be set appropriately in accordance with a required light amount. Furthermore, the light-emitting element may be placed on the base via a submount substrate. As the light-emitting element, a light-emitting element made of, for example, an organic semiconductor material and an inorganic semiconductor material also can be used, without being limited to a compound semiconductor material.

The light-emitting device of the present invention includes a first sealing material layer covering the light-emitting element and a second sealing material layer surrounding a side surface of the first sealing material layer, and the refractive index of the first sealing material layer is different from that of the second sealing material layer. According to the light-emitting device of the present invention, the radiation pattern from the light-emitting element can be controlled by controlling the refractive index of the first sealing material layer and the refractive index of the second sealing material layer. In the light-emitting device of the present invention, the radiation pattern from the light-emitting element can be controlled even without a convex lens, a diffraction grating, a shielding member, or the like. Therefore, the miniaturization and reduction in thickness of the light-emitting device can be performed easily, and the decrease in a light output efficiency of the light-emitting device can be prevented. The second sealing material layer need not surround the entire side surface of the first sealing material layer. Furthermore, as a radiation pattern, a multimodal pattern also can be formed in addition to a unifodal pattern. This case is suitable, for example, for a sensor light source requiring radiation patterns in a plurality of directions.

In the light-emitting device of the present invention, for example, when the refractive index (n2) of the second sealing material layer is set to be higher than the refractive index (n1) of the first sealing material layer, the radiation angle of light emitted from the light-emitting element can be made narrow. Particularly, in the case where the refractive index ratio (n1/n2) is 0.9 or less, the above-mentioned radiation angle can be made sufficiently narrow. Because of this, the light-emitting device of the present invention can be applied to an illumination device for performance such as spot light. Furthermore, for example, when the refractive index (n2) of the second sealing material layer is set to be lower than the refractive index (n1) of the first sealing material layer, the radiation angle of light emitted from the light-emitting element can be enlarged. Particularly, in the case where the refractive index ratio (n1/n2) is 1.1 or more, the above-mentioned radiation angle can be enlarged sufficiently. Because of this, the light-emitting device of the present invention can be applied to a general illumination device such as indoor illumination. In order to control the refractive indices of the first and second sealing material layers as described above, for example, the constituent materials for the layers may be selected so that the refractive indices of the respective layers have the above-mentioned relationship.

In the light-emitting device of the present invention, the first sealing material layer may be distributed asymmetrically with respect to an optical axis of light emitted from the light-emitting element. This is because an anisotropic radiation pattern can be obtained. Herein, the above-mentioned "the first sealing material layer may be distributed asymmetrically" refers to the first sealing material layer not being symmetric about a point with respect to the above-mentioned optical axis. In this case, the light-emitting device of the present invention can be applied to an illumination device that illuminates only a particular direction, as in a headlight of an automobile (that is, a headlight designed so that the radiation direction on an opposite line side is directed downward compared with that on a pedestrian side so as not to obscure the vision of a driver of an oncoming vehicle). Even if the second sealing material layer is distributed asymmetrically with respect to an optical axis of light emitted from the light-emitting element, similar effects can be exhibited.

There is no particular limit to materials constituting the first and second sealing material layers. Various materials can be used as long as at least a part of light emitted from the light-emitting element can pass through the first and second sealing material layers, respectively. For example, a metal oxide such as aluminum oxide (refractive index: 1.63), cerium oxide (refractive index: 2.2), hafnium oxide (refractive index: 1.95), magnesium oxide (refractive index: 1.74), niobium oxide (refractive index: 2.33), tantalum oxide (refractive index: 2.16), zirconium oxide (refractive index: 2.05), zinc oxide (refractive index: 2.1), titanium oxide (refractive index: 2.4), yttrium oxide (refractive index: 1.87), silicon oxide (refractive index: 1.5), indium oxide (refractive index: 2), tin oxide (refractive index: 2), tungsten oxide (refractive index: 2.2), and vanadium oxide (refractive index: 2.0); inorganic materials such as silicon nitride (refractive index: 1.9), gallium nitride (refractive index: 2.5), silicon carbide (refractive index: 2.6), calcium fluoride (refractive index: 1.43), calcium carbonate (refractive index: 1.58), barium sulfate (refractive index: 1.64), copper sulfide (refractive index: 2.1), tin sulfide (refractive index: 2.0), zinc sulfide (refractive index: 2.37); diamond (refractive index: 2.4); a mixture thereof; or the like can be used. The above-mentioned value of a refractive index in parentheses refers to the refractive index of each material with respect to light having a wavelength of 550 nm.

An example of a method for forming the first and second sealing material layers, using the materials listed above, includes a sol-gel process. For example, in the case of forming a sealing material layer made of silicon oxide by the sol-gel process, metal alkoxide (methyl silicate, N-butylsilicate, etc.) is hydrolyzed to be solated, the viscosity of the sol is adjusted to a predetermined value using alcohols such as ethylene glycol, and the resultant sol is applied to a desired place on the base, followed by drying at 200° C. for tens of minutes and heating at 300° C. for about 2 hours, whereby a sealing material layer made of silicon oxide is obtained. Even in the case of using a metal oxide such as titanium oxide in place of silicon oxide, a sealing material layer can be formed by a similar method. Furthermore, in the case of using the sol-gel method, a nanoparticle material described later also can be used together. For example, a nanoparticle material is dispersed in metal alkoxide, followed by gelation, whereby a sealing material layer made of a metal oxide and a nanoparticle material is obtained.

As a material constituting the first and second sealing material layers, resin such as epoxy resin, silicone resin, acrylic resin, urea resin, amide resin, imide resin, polycarbonate resin, polyphenyl sulfide resin, a liquid crystal polymer, acrylonitrile-butadiene-styrene resin (ABS resin), methacrylic resin (PMMA resin), a cyclic olefin copolymer, or a mixture thereof, or glass such as low-melting point glass may be used. In the case of using a light-transparent material such as these resins or glass, the refractive index of the above-mentioned light-transparent material can be increased by irradiating these light-transparent materials with an electron beam or an ion beam (a hydrogen ion beam, a helium ion beam, etc.).

As a glass material with a high refractive index, $TeO_2$—$B_2O_3$—$ZnO$-based glass appropriately mixed with $TeO_2$, $GeO_2$, $B_2O_3$, $GaO_3$, $Bi_2O_3$, $ZnO$, $Y_2O_3$, $La_2O_3$, $Gd_2O_3$, $Ta_2O_5$, $TiO_2$, $Gd_2O_3$, or $Ta_2O_5$ can be used. By appropriately adjusting the composition ratio, the above-mentioned glass can have a high refractive index of about 2. Furthermore, the above-mentioned glass has a softening temperature in a range of 400° C. to 500° C., and can be subjected to press working.

Furthermore, a composite material also can be used, which is obtained by using these transparent materials as a base material, and dispersing a nanoparticle material made of the above-mentioned metal oxide or inorganic material in the base material. In this case, by adjusting the amount of the above-mentioned nanoparticle material to be dispersed in the above-mentioned base material, the refractive index of the sealing material layer can be adjusted. Furthermore, in the case of using curable resin as a base material, if the above-mentioned nanoparticle material is dispersed in curable resin in an uncured state, the thixotropy of the above-mentioned curable resin before being cured is enhanced, so that the sealing material layer can be formed easily in a desired shape. Furthermore, the heat conductivity is enhanced compared with the case of using resin alone, so that the heat from the light-emitting element can be released efficiently.

Furthermore, as the material constituting the first and second sealing material layers, a complex material in which a nanoparticle material is dispersed in the above-mentioned light transparent material may be used. As the nanoparticle material, for example, ultrafine particles made of the above-mentioned metal oxide, inorganic material, or the like can be used, and those having an average particle size of ¼ or less of the emission wavelength in the above-mentioned light transparent material that is a sealing material are preferable. This is because, if the average particle size of the nanoparticle material is in the above range, a sealing material layer having sufficient transparency can be obtained. The above-mentioned "average particle size" may be, for example, an average value of particle sizes of primary particles read from an observed image of a scanning electron microscope (for example, an average value of particle sizes of 10 primary particles). In particular, the above-mentioned average particle size may be at least 1 nm and at most 100 nm, preferably at least 1 nm and at most 50 nm, and more preferably at least 1 nm and at most 10 nm, in view of dispersion.

In the case of using the light-emitting device of the present invention as a white light source, a wavelength converting material that converts the wavelength of a part of light emitted from the light-emitting element may be dispersed in at least one of the first and second sealing material layers. As such a wavelength converting material, for example, a red phosphor emitting red light, a yellow phosphor emitting yellow light, a green phosphor emitting green light, or the like can be used. As the above-mentioned red phosphor, for example, nitridosilicate-based $Sr_2Si_5N_8$:$Eu^{2+}$, nitridoaluminosilicate-based $CaAlSiN_3$:$Eu^{2+}$, oxonitridoaluminosilicate-based $Sr_2Si_4AlON_7$:$Eu^{2+}$, LOS-based $La_2O_2S$:$Eu^{3+}$, or the like can be used. As the above-mentioned yellow phosphor, for example, (Sr, Ba)$_2SiO_4$:$Eu^{2+}$, (Y, Gd)$_3Al_5O_{12}$:$Ce^{3+}$, or the like can be used. As the above-mentioned green phosphor, for example, $BaMgAl_{10}O_{17}$:$Eu^{2+}$, $BaMgAl_{10}O_{17}$:$Mn^{2+}$, $SrAl_2O_4$:$Eu^{2+}$, silicate-based (Ba, Sr)$_2SiO_4$:$Eu^{2+}$, or the like can be used. Furthermore, as the above-mentioned wavelength converting material, an organic colorant such as rhodamine, a phosphorus phosphor, or the like also can be used. In the case of using, as the light-emitting element, a LED emitting blue-violet light having a wavelength of 420 nm or less or a LED emitting ultraviolet light having a wavelength of 380 nm or less, for example, the above-mentioned red phosphor and green phosphor, and a blue phosphor emitting blue light may be used together, as the wavelength converting material. As the blue phosphor, an aluminate phosphor such as $BaMgAl_{10}O_{17}$:$Eu^{2+}$, a silicate phosphor such as $Ba_3MgSi_2O_8$:$Eu^{2+}$, or the like can be used.

The light-emitting device of the present invention further may include a reflective layer that reflects light emitted from the light-emitting element to a light output side. This is because the light output efficiency is enhanced. In this case, as a material for a reflection surface of the reflective layer, metal such as Al, Ag, Au, Ni, Rh, Pd, or an alloy containing any of these metals; a metal oxide such as aluminum oxide, cerium oxide, hafnium oxide, magnesium oxide, niobium oxide, tantalum oxide, zirconium oxide, zinc oxide, titanium oxide, yttrium oxide, silicon oxide, indium oxide, tin oxide, tungsten oxide, or vanadium oxide; an inorganic material such as silicon nitride, gallium nitride, silicon carbide, calcium fluoride, calcium carbonate, copper sulfide, tin sulfide, zinc sulfide, barium sulfate, or a mixture thereof can be used. In the case of using a particle-shaped metal oxide or an inorganic material, those having an average particle size of 0.3 to 3 μm larger than that in a sealing material preferably are used, in terms of the reflection effect due to diffusion and scattering. Furthermore, a distribution Bragg reflection mirror (thickness: 0.1 to 1 μm) made of a multi-layered film in which at least two kinds of metal oxides and inorganic materials are stacked alternately also is effective as the reflective layer.

Hereinafter, the present invention will be described by way of embodiments with reference to the drawings. In the drawings to be referred to, components having substantially the same functions are denoted with the same reference numerals, and repeated descriptions may be omitted. In the embodiments, in order to simplify the description, examples using at least two kinds of sealing material layers having different refractive indices are illustrated, and the number of sealing material layers also can be increased further.

Figure 2:
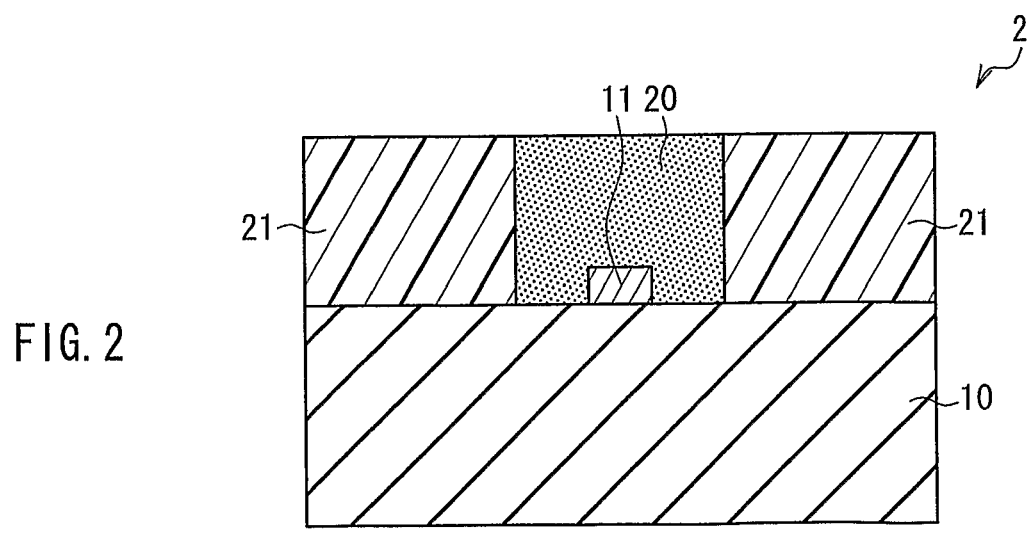
FIG. 2 is a schematic cross-sectional view of a light-emitting device of Embodiment 2 according to the present invention.
Figure 3:
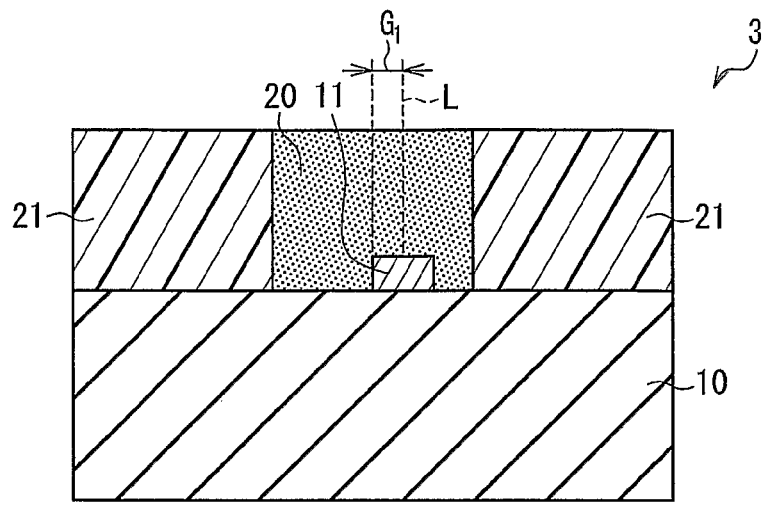
FIG. 3 is a schematic cross-sectional view of a light-emitting device of Embodiment 3 according to the present invention.

FIGS. 1-3 respectively are schematic cross-sectional views of light-emitting devices of Embodiments 1-3 according to the present invention.

As shown in FIG. 1, a light-emitting device 1 includes a base 10, a light-emitting element 11 placed on the base 10, a first sealing material layer 12 covering the light-emitting element 11, and a second sealing material layer 13 surrounding a side surface of the first sealing material layer 12. The refractive index of the second sealing material layer 13 is higher than that of the first sealing material layer 12. This enables the radiation angle of light emitted from the light-emitting element 11 to be small, so that the light-emitting device 1 can be applied as an illumination device used for performance such as rising of an object with spot light.

In a light-emitting device 2 shown in FIG. 2, the refractive index of a first sealing material layer 20 covering the light-emitting element 11 is higher than that of a second sealing material layer 21 surrounding a side surface of the first sealing material layer 20. The remaining configuration is the same as that of the above-mentioned light-emitting device 1 (see FIG. 1). This enables the radiation angle of light emitted from the light-emitting element 11 to be large, so that the light-emitting device 2 can be applied as a general illumination device such as in-door illumination.

In a light-emitting device 3 shown in FIG. 3, the first sealing material layer 20 is distributed asymmetrically with respect to an optical axis L of light emitted from the light-emitting element 11. The remaining configuration is the same as that of the above-mentioned light-emitting device 2 (see FIG. 2). This enables the light emitted from the light-emitting element 11 to have a radiation pattern with anisotropy. Thus, the light-emitting device 3 can be applied as an illumination device that illuminates only a particular direction, such as a headlight of an automobile (that is, a headlight designed so that the radiation direction on an opposite line side is directed downward compared with that on a pedestrian side so as not to obscure the vision of a driver of an oncoming vehicle). Furthermore, in a street large display attached to a wall surface or the like in an upper part of a building, a radiation pattern is directed generally downward so that an image can be seen from a direction where people are present. The light-emitting device 3 can be applied to such an application that requires a radiation pattern with anisotropy.

The light-emitting devices 1-3 of Embodiments 1-3 according to the present invention have been described. However, the present invention is not limited thereto. For example, an upper surface of the first sealing material layer may be covered with the second sealing material layer. In this case, it is preferable that the thickness of the second sealing material layer placed on the first sealing material layer is less than 20% with respect to the width of the first sealing material layer, since the second sealing material layer with such a thickness does not influence a radiation pattern largely. On the contrary, in the case of allowing the second sealing material layer to influence a radiation pattern positively, the thickness of the second sealing material layer placed on the first sealing material layer is 20% or more with respect to the width of the first sealing material layer. In terms of the miniaturization and thinning of the light-emitting device, it is preferable that the upper surface of the first sealing material layer is not covered with the second sealing material layer. The boundary between the first sealing material layer and the second sealing material layer may not be perpendicular to the base.

Figure 4:
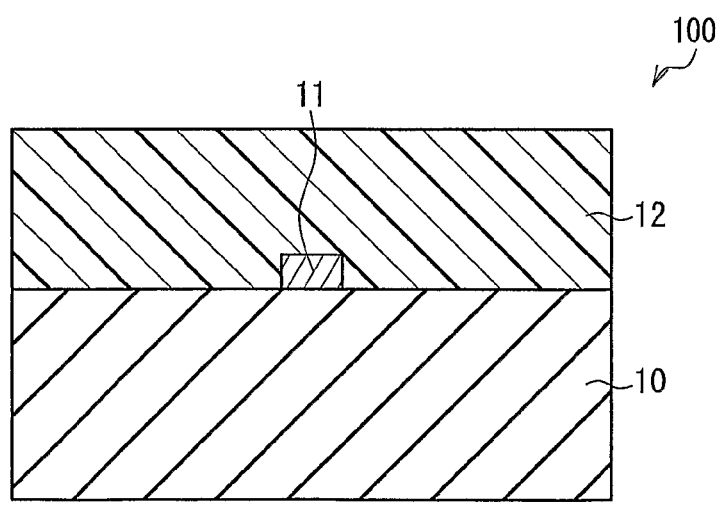
FIG. 4 is a schematic cross-sectional view of a light-emitting device of a comparative example.

Next, regarding specific examples of the above-mentioned light-emitting devices 1-3, and a comparative example of the light-emitting device 100 (see FIG. 4), radiation patterns were measured by a measurement method described later. The light-emitting device 100 is the same as the light-emitting device 1 (see FIG. 1) described above, except for using only the first sealing material layer 12 as a sealing material layer.

(Constituent Material, Size, etc. of a Light-Emitting Device)

As the light-emitting element 11 used in the specific examples of the light-emitting devices 1-3 and the light-emitting device 100, a GaN-based LED chip (thickness: 0.1 mm, side: 0.3 mm) using a sapphire substrate was used. As the base 10, a base composed of alumina was used. The above-mentioned LED chip is bonded to a mounting portion provided in a part of a metal wiring pattern (not shown) for wiring to the LED chip provided on the base 10 by flip chip bonding via Au bumps. Furthermore, as the first sealing material layer 12 and the second sealing material layer 21, silicone resin (LPS-5510) produced by Shinetsu Chemical Co., Ltd. was used. Both of the first sealing material layer 12 and the second sealing material layer 21 had a refractive index of 1.5 with respect to light having a wavelength of 550 nm. Furthermore, as the second sealing material layer 13 and the first sealing material layer 20, a composite material was used, in which titanium oxide particles (average particle size: 5 nm) were dispersed in an amount of 60% by volume in the above-mentioned silicone resin. Both of the second sealing material layer 13 and the first sealing material layer 20 had a refractive index of 2.0 with respect to light having a wavelength of 550 nm. The specific examples of the light-emitting devices 1-3 and the light-emitting device 100 had an outer diameter D1 (see FIG. 1) of 2 mm, a thickness T1 (see FIG. 1) of the sealing material layer of 0.55 mm, and a thickness T2 (see FIG. 1) of the base 10 of 1 mm. The first sealing material layers 12, 20 had a diameter D2 (see FIG. 1) of 0.7 mm. In the specific example of the light-emitting device 3, a displacement amount G1 (see FIG. 3) of the first sealing material layer 20 with respect to the optical axis L of the first sealing material layer 20 was 0.2 mm.

When a volume ratio of the titanium oxide particles occupying a mixture of silicone resin (refractive index n2=1.5) to be a base material and titanium oxide particles (refractive index n1=2.4) is defined to be P1, a refractive index nc of the mixture is given by the following Expression (1) from the Maxwell-Garnet theory.

$$nc^2 = n2^2 \times \{n1^2 + 2n2^2 + 2P1(n1^2 - n2^2)\} / \{n1^2 + n2^2 - P1(n1^2 - n2^2)\} \quad (1)$$

The refractive indices of the second sealing material layer 13 and the first sealing material layer 20 can be calculated to be 2.0 from Expression (1).

The mounting form of the light-emitting element is not limited to the flip chip bonding of a light-emitting element with an anode electrode and a cathode electrode to a mounting surface side. For example, in a light-emitting element having an anode electrode on either one of an upper surface and a lower surface, and a cathode electrode on the other surface, the lower surface may be bonded by soldering and the upper surface may be bonded by wire bonding. In a light-emitting element having an anode electrode and a cathode electrode on an upper surface, the lower surface may be bonded with a silver paste, and both the electrodes on the upper surface may be bonded by different wire bondings. Thus, various kinds of bonding methods can be performed.

(Method for Measuring a Radiation Pattern)

Figure 5:
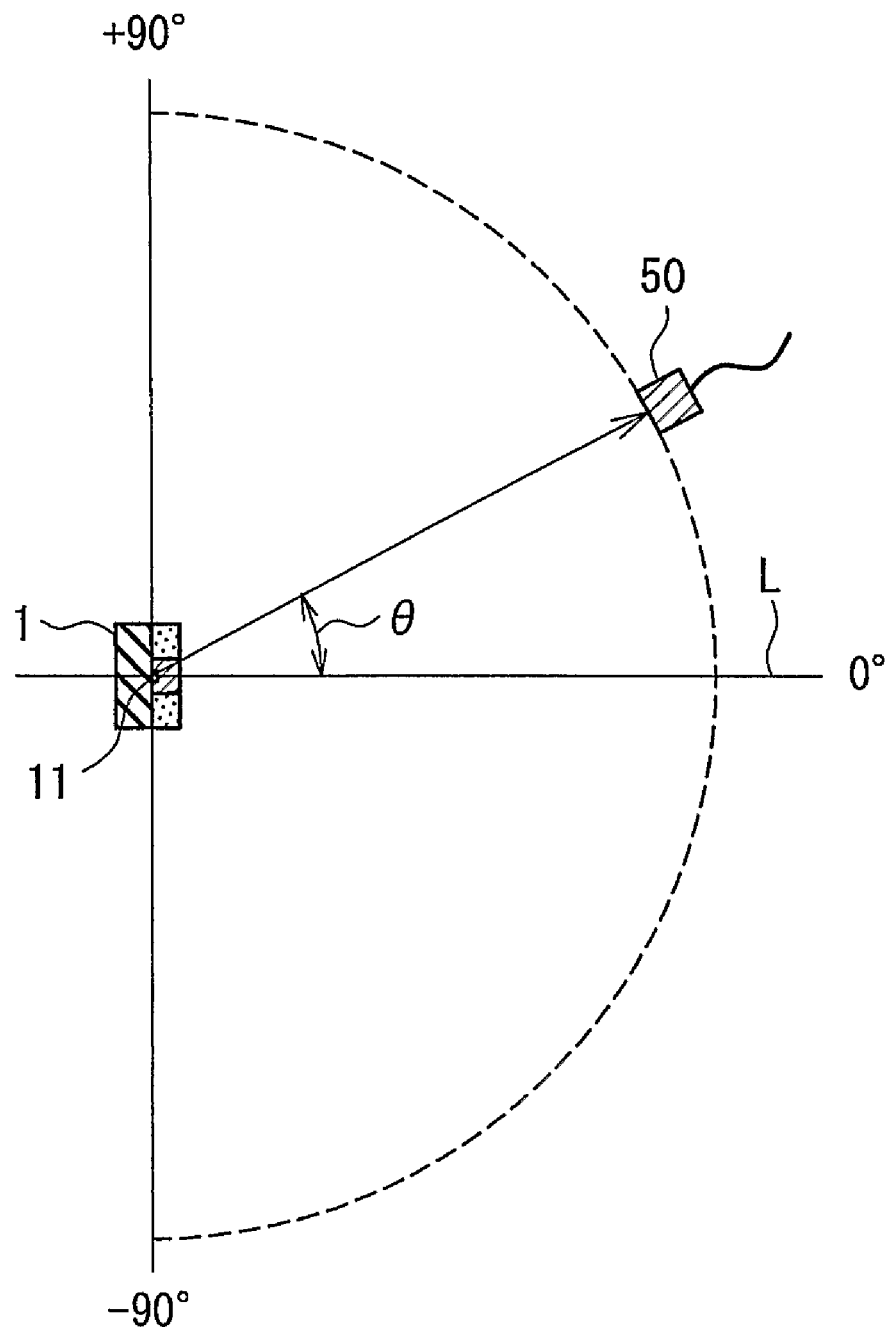
FIG. 5 is a schematic diagram illustrating a method for measuring a radiation pattern of the light-emitting device.
Figure 6:
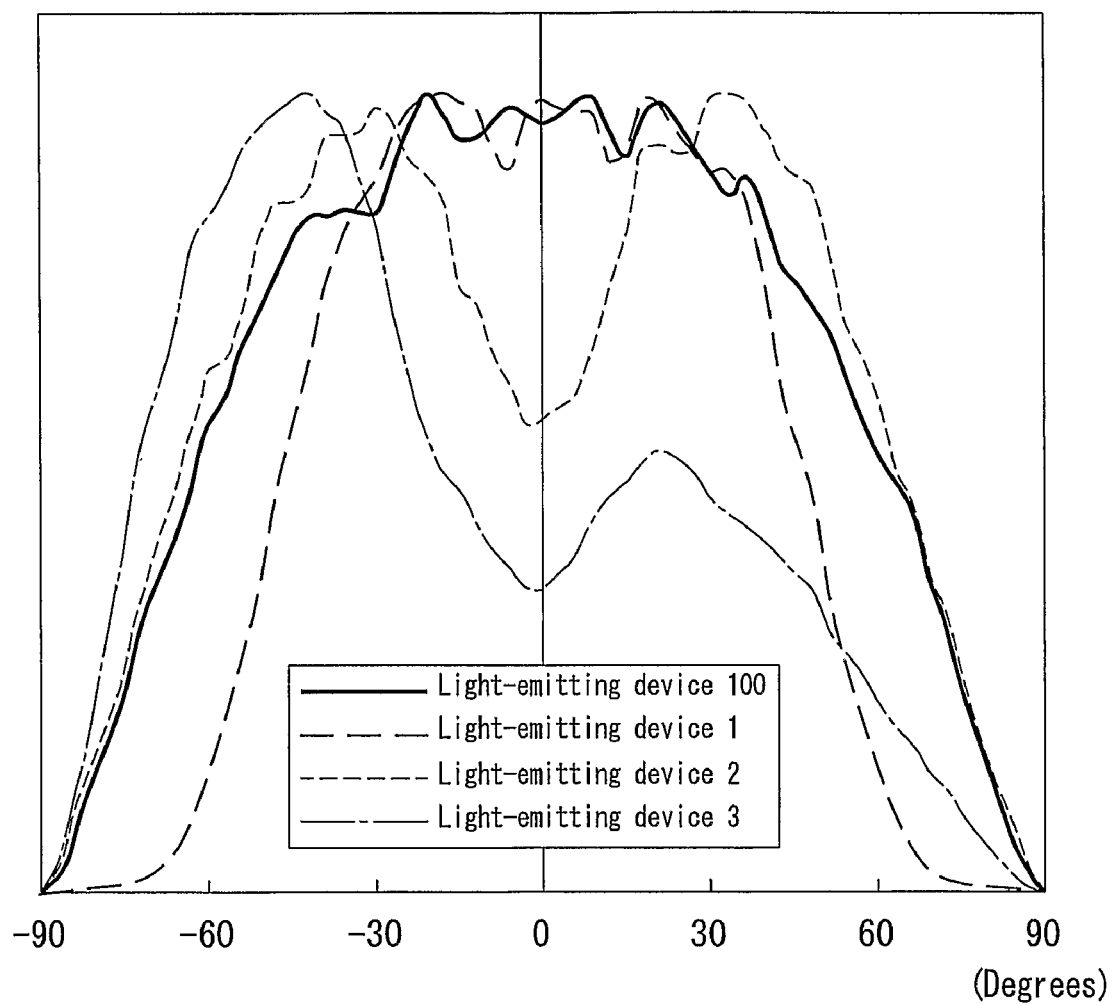
FIG. 6 is a graph showing radiation patterns of the light-emitting devices of examples according to the present invention and the comparative example.

Next, a method for measuring a radiation pattern will be described with reference to FIG. 5. FIG. 5 is a schematic view illustrating a method for measuring a radiation pattern of the specific example of the light-emitting device 1. While the light-emitting device 1 was allowed to emit light, the emission strength on a semicircle (represented by a broken line in FIG. 5) with a radius of 1 m with the light-emitting device 1 being the center was measured with a detector 50 (S9219 produced by Hamamatsu Photonics K.K., diameter of a light-receiving surface: 11.3 mm). Then, regarding a radiation angle θ of the light-emitting element 11 with respect to the optical axis L, the measured emission strength was plotted. Regarding the specific examples of the light-emitting devices 2 and 3 and the light-emitting device 100, radiation patterns were measured by the same measurement method as that described above. FIG. 6 shows the obtained results. In FIG. 6, the peak of each emission strength is standardized to be 1.

As is understood from FIG. 6, in the light-emitting devices 1-3, the radiation patterns were controlled with respect to the light-emitting device 100. In FIG. 6, the half-widths of the light-emitting devices 1, 2, 3, and 100 were 96°, 148°, 102° and 123°.

Figure 7:
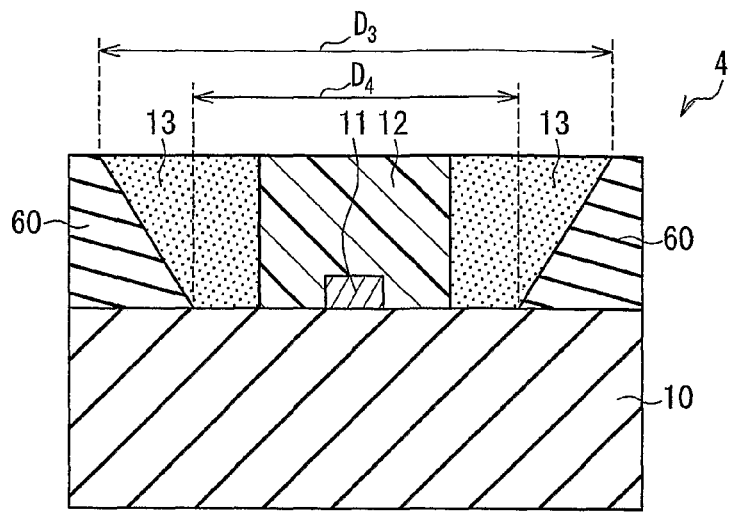
FIG. 7 is a schematic cross-sectional view of a light-emitting device of Embodiment 4 of according to present invention.
Figure 8:
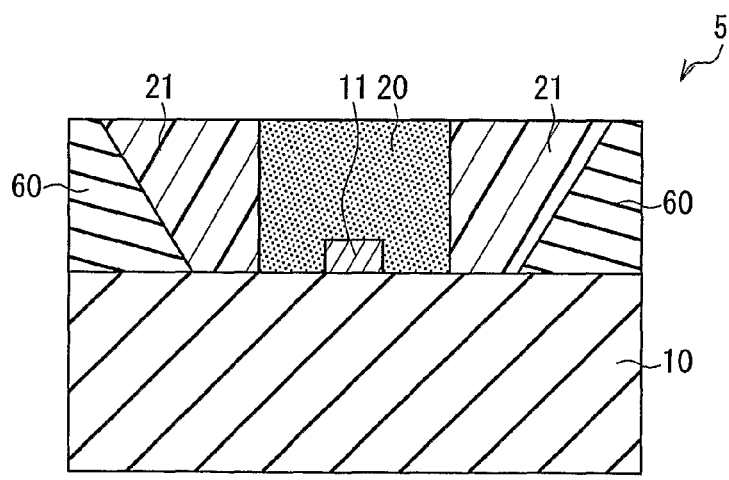
FIG. 8 is a schematic cross-sectional view of a light-emitting device of Embodiment 5 according to the present invention.

FIGS. 7 and 8 are schematic cross-sectional views of light-emitting devices of Embodiments 4 and 5 according to the present invention.

As shown in FIG. 7, a light-emitting device 4 is the same as the light-emitting device 1 (see FIG. 1) described above, except that the light-emitting device 4 includes a reflective layer 60 formed on the base 10, and a concave portion of the reflective layer 60 is filled with a sealing material layer. Furthermore, as shown in FIG. 8, a light-emitting device 5 is the same as the light-emitting device 2 (see FIG. 2) described above, except that the light-emitting device 5 includes the reflective layer 60 formed on the base 10 and a concave portion of the reflective layer 60 is filled with a sealing material layer.

Figure 9:
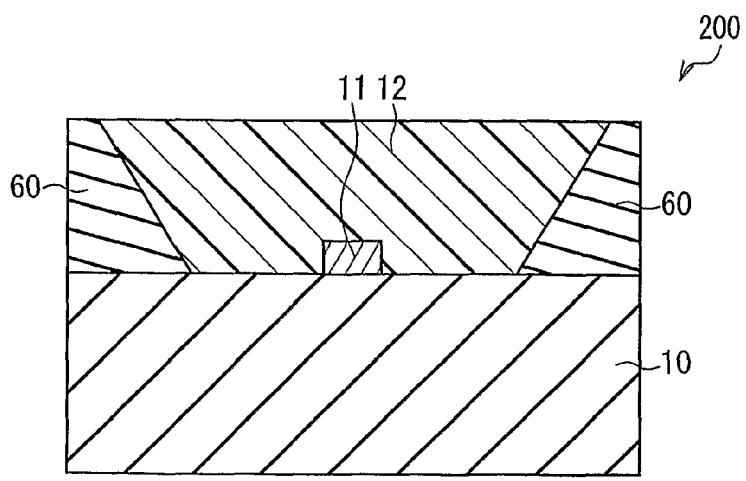
FIG. 9 is a schematic cross-sectional view of a light-emitting device of a comparative example.
Figure 10:
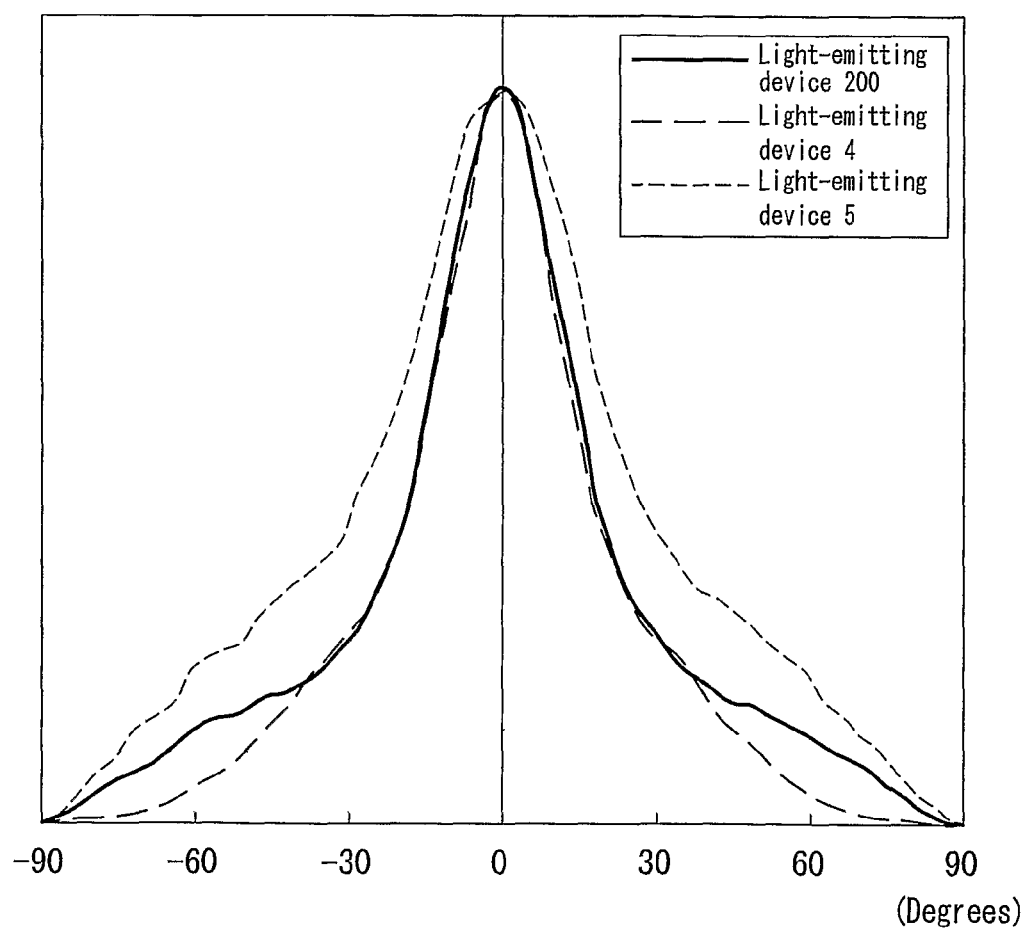
FIG. 10 is a graph showing radiation patterns of the light-emitting devices of examples according to the present invention and the comparative example.

Next, regarding specific examples of the light-emitting devices 4 and 5 described above, and a comparative example of the light-emitting device 200 (see FIG. 9), radiation patterns were measured by the same measurement method as that described above. The light-emitting device 200 is the same as the light-emitting device 4 (see FIG. 7) described above, except that only the first sealing material layer 12 was used as a sealing material layer. In the specific examples of the light-emitting devices 4 and 5 and the light-emitting device 200, an output side aperture diameter D3 (see FIG. 7) of the reflective layer 60 was 2 mm, and a base side aperture diameter D4 (see FIG. 7) of the reflective layer 60 was 1.2 mm. Furthermore, as a constituent material for a reflection surface of the reflective layer 60, AMODEL A-4122 (containing polyphthalamide as a main component and having a reflectance of at least 90% with respect to light in a range of 440 to 700 nm) produced by Solvay Advanced Polymers K.K. was used. The remaining constituent materials, sizes, and the like of the light-emitting device were set to be the same as those of the specific examples of the light-emitting devices 1-3 described above and the light-emitting device 100. FIG. 10 shows obtained results. In FIG. 10, the peak of each emission strength is standardized to be 1.

As is understood from FIG. 10, in the light-emitting devices 4 and 5, the radiation patterns were controlled with respect to the light-emitting device 200. In FIG. 10, the half-widths of the light-emitting devices 4, 5, and 200 were 31°, 48°, and 33°.

Figure 11:
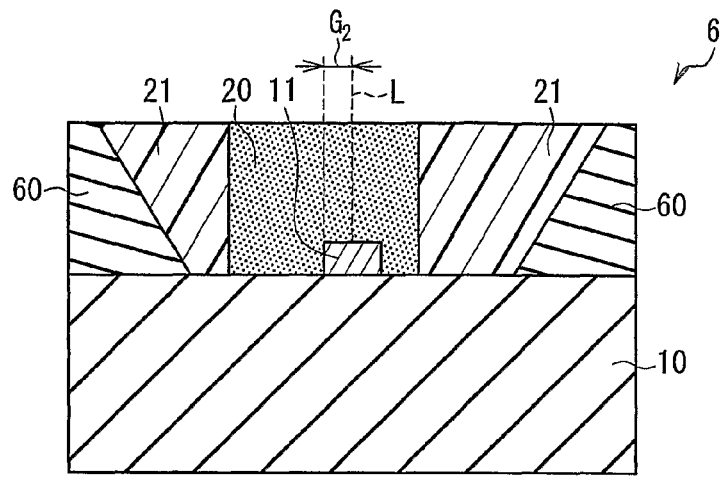
FIG. 11 is a schematic cross-sectional view of a light-emitting device of Embodiment 6 according to the present invention.
Figure 12:
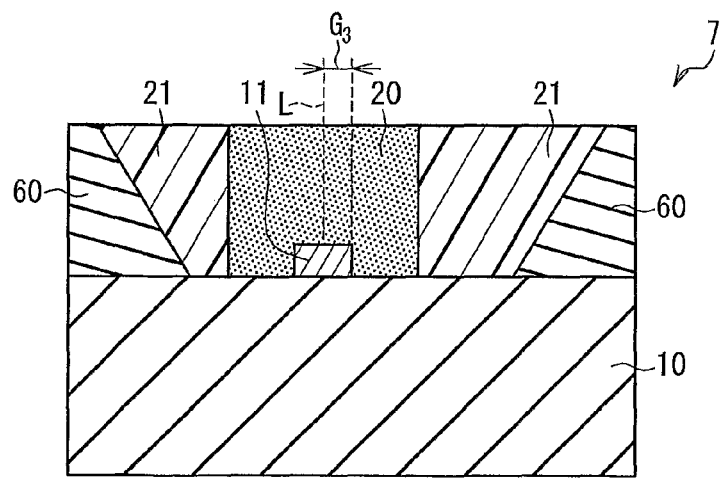
FIG. 12 is a schematic cross-sectional view of a light-emitting device of Embodiment 7 according to the present invention.

FIGS. 11 and 12 respectively are schematic cross-sectional views of the light-emitting devices of Embodiments 6 and 7 according to the present invention.

In the light-emitting device 6 shown in FIG. 11, the first sealing material layer 20 is distributed asymmetrically with respect to the optical axis L of light emitted from the light-emitting element 11. The remaining configuration is the same as that of the light-emitting device 5 (see FIG. 8) described above. Furthermore, in the light-emitting device 7 shown in FIG. 12, the second sealing material layer 21 is distributed asymmetrically with respect to the optical axis L of light emitted from the light-emitting element 11. The remaining configuration is the same as that of the light-emitting device 5 (see FIG. 8) described above.

Figure 13:
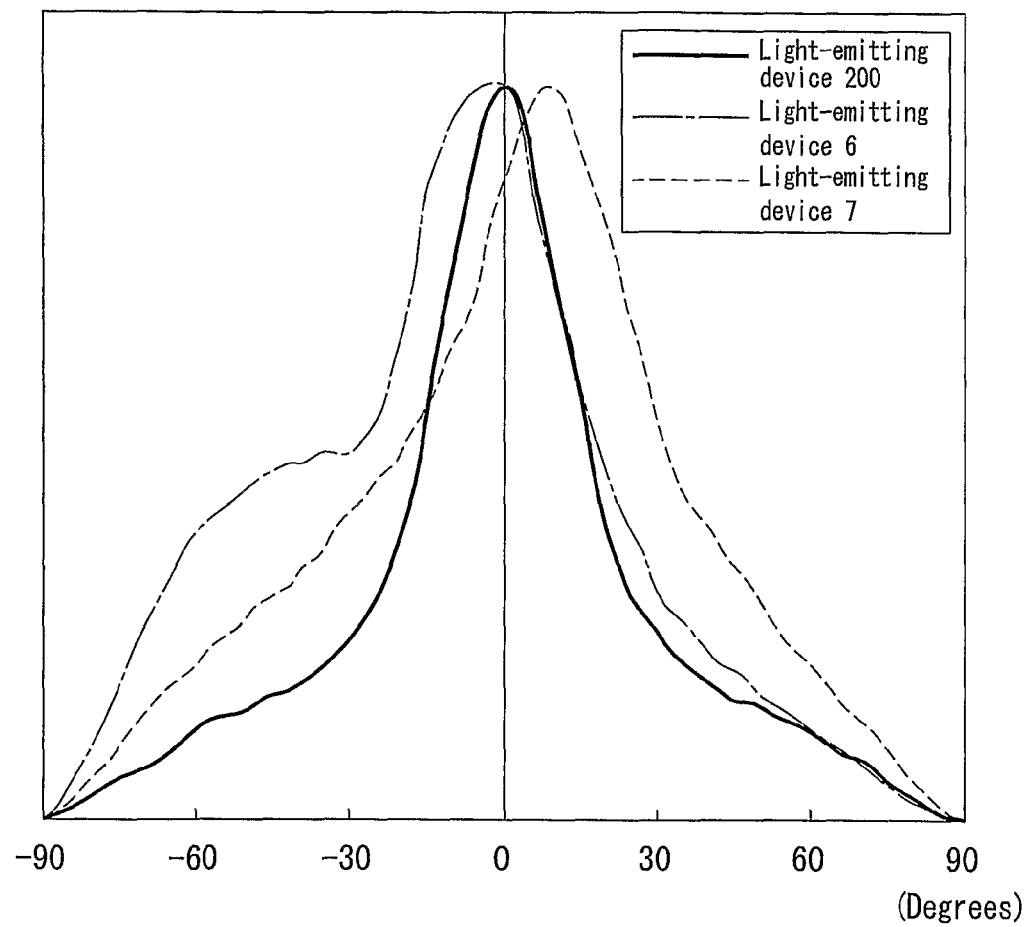
FIG. 13 is a graph showing radiation patterns of the light-emitting devices of examples according to the present invention and the comparative example.

Next, regarding the specific examples of the light-emitting devices 6 and 7 described above, radiation patterns were measured by the same measurement method as that described above. In the specific example of the light-emitting device 6, a displacement amount G2 (see FIG. 11) of the first sealing material layer 20 with respect to the optical axis L was 0.2 mm. Furthermore, in the specific example of the light-emitting device 7, a displacement amount G3 (see FIG. 12) of the second sealing material layer 21 with respect to the optical axis L was 0.2 mm. The remaining constituent materials, sizes, and the like of the light-emitting devices were set to be the same as those in the specific example of the light-emitting device 5 described above. FIG. 13 shows obtained results. In FIG. 13, the peak of each emission strength is standardized to be 1, and the result of the above-mentioned light-emitting device 200 also is shown as a comparison.

As is understood from FIG. 13, in the light-emitting devices 6 and 7, the radiation patterns were controlled with respect to the light-emitting device 200. In FIG. 13, the half-widths of the light-emitting devices 6 and 7 were 51° and 52°, respectively.

Figure 14A:
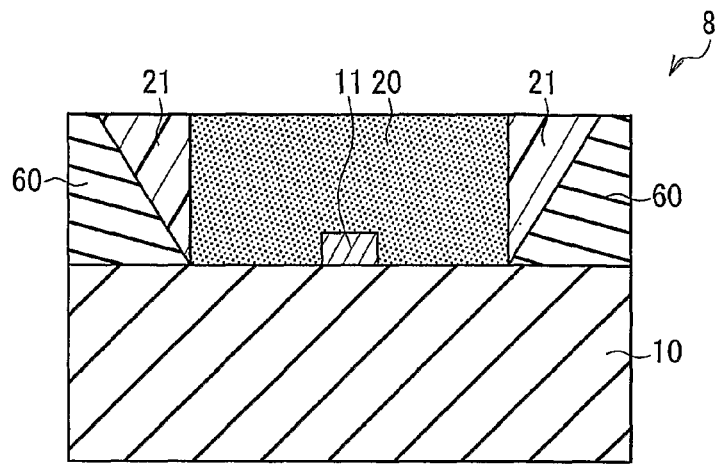
FIG. 14A is a schematic cross-sectional view of a light-emitting device of Embodiment 8 according to the present invention.
Figure 14B:
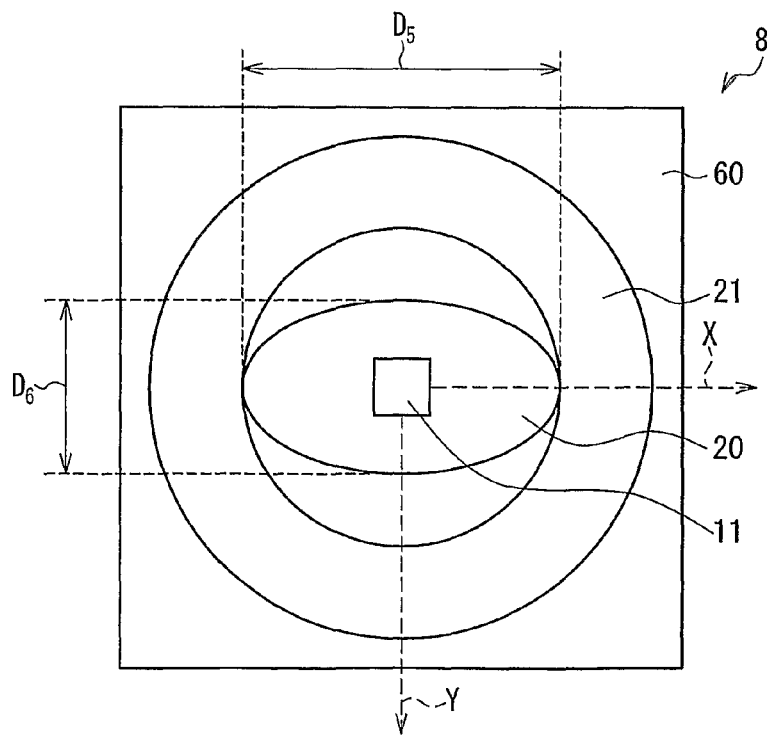
FIG. 14B is a plan view seen from a sealing material layer side of the light-emitting device in FIG. 14A.

FIG. 14A is a schematic cross-sectional view of the light-emitting device of Embodiment 8 according to the present invention. Furthermore, FIG. 14B is a plan view of the light-emitting device in FIG. 14A seen from a sealing material layer side. The light-emitting device 8 shown in FIGS. 14A and 14B is the same as the light-emitting device 5 (see FIG. 8) described above, except that the first sealing material layer 20 is formed substantially in an elliptic cylinder shape.

Figure 15:
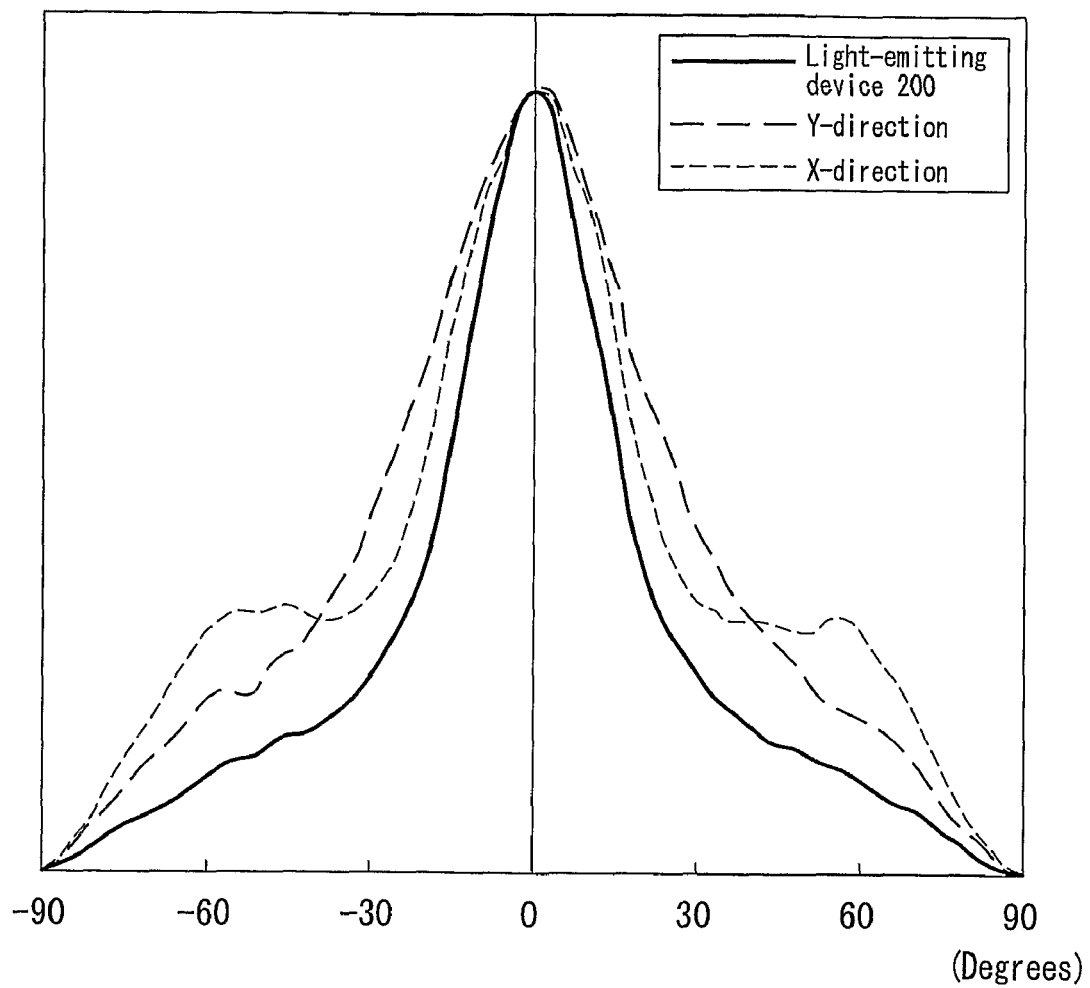
FIG. 15 is a graph showing radiation patterns of the light-emitting devices of an example according to the present invention and the comparative example.

Next, regarding the specific example of the light-emitting device 8 described above, a radiation pattern was measured by the same measurement method as that described above. In the specific example of the light-emitting device 8, a major diameter D5 (see FIG. 14B) of the first sealing material layer 20 was 1.2 mm, and a minor diameter D6 (see FIG. 14B) of the first sealing material layer 20 was 0.7 mm. The remaining constituent materials, sizes, and the like of the light-emitting device are the same as those of the specific example of the light-emitting device 5 described above. FIG. 15 shows obtained results. FIG. 15 shows the case where an X-direction (see FIG. 14B) that is a direction orthogonal to the minor axis of the first sealing material layer 20 is set to be an optical axis, the case where a Y-direction (see FIG. 14B) that is a direction orthogonal to the major axis of the first sealing material layer 20 is set to be an optical axis, and the results of the light-emitting device 200 described above as a comparison, with the peak of each emission strength being standardized to be 1.

As is understood from FIG. 15, in the light-emitting device 8, a radiation pattern was controlled with respect to the light-emitting device 200. In FIG. 15, the half width in the X-direction is 54°, and the half width in the Y-direction was 42°.

Figure 16A:
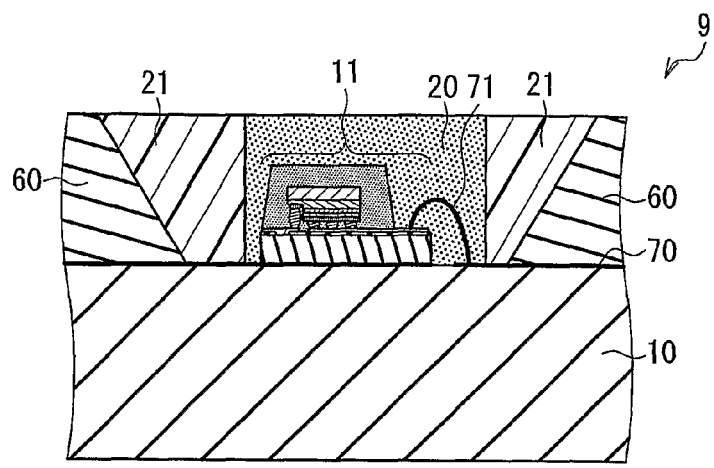
FIG. 16A is a schematic cross-sectional view of a light-emitting device of Embodiment 9 according to the present invention.

FIG. 16A is a schematic cross-sectional view of a light-emitting device of Embodiment 9 according to the present invention. Furthermore, FIG. 16B is an enlarged view of a light-emitting element in the light-emitting device in FIG. 16A.

As shown in FIG. 16A, in the light-emitting device 9, a light-emitting element 11 is mounted on a wiring pattern 70 formed on the base 10 via a wire 71.

Figure 16B:
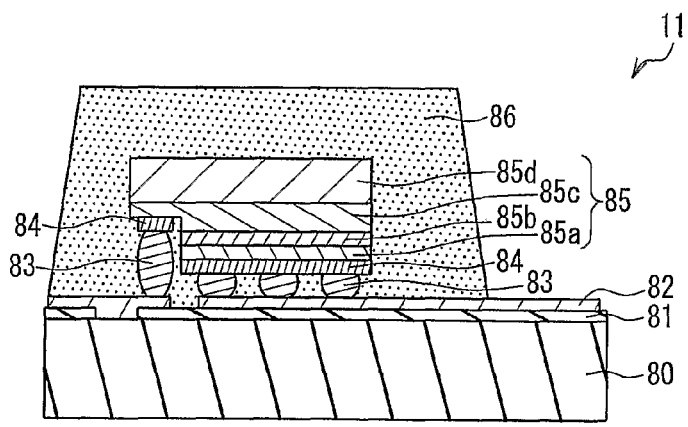
FIG. 16B is an enlarged view of a light-emitting element in the light-emitting device in FIG. 16A.

As shown in FIG. 16B, the light-emitting element 11 includes a submount substrate 80 made of n-Si or the like, a Ti/Pt/Al high reflective wiring pattern 82 formed on the submount substrate 80 via a SiO₂ film 81, a LED chip 85 mounted on the Ti/Pt/Al high reflective wiring pattern 82 via bumps 83 and electrodes 84, and a phosphor layer 86 formed so as to cover the LED chip 85.

In the LED chip 85, a p-GaN layer 85a, an InGaN/GaN quantum well light-emitting layer 85b, an n-GaN layer 85c, and a GaN substrate 85d are stacked in this order from the submount substrate 80 side. Furthermore, in the phosphor layer 86, a phosphor material converting the wavelength of a part of light emitted from the InGaN/GaN quantum well light-emitting layer 85b is dispersed. The remaining configuration is the same as that of the light-emitting device 5 (see FIG. 8) described above. The light-emitting device 9 can be used as a white light source due to the presence of the phosphor layer 86.

In Embodiments 1-9, the examples in which the thickness of the first sealing material layer in a horizontal direction is constant have been illustrated. However, for example, it is possible to prescribe the thickness in the horizontal direction to be successively decreased or increased in a light output direction, thereby controlling various radiation patterns.

Figure 17:
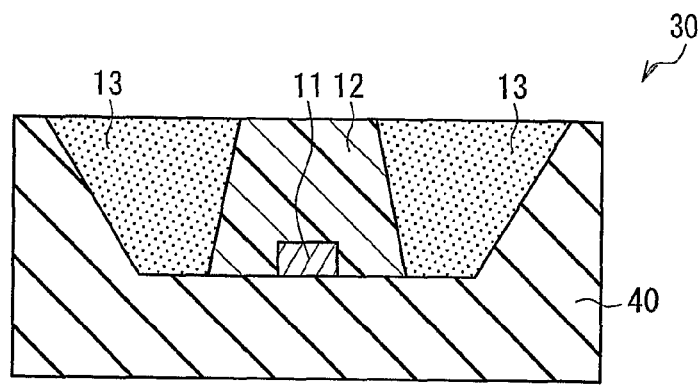
FIG. 17 is a schematic cross-sectional view of a light-emitting device of Embodiment 10 according to the present invention.
Figure 18:
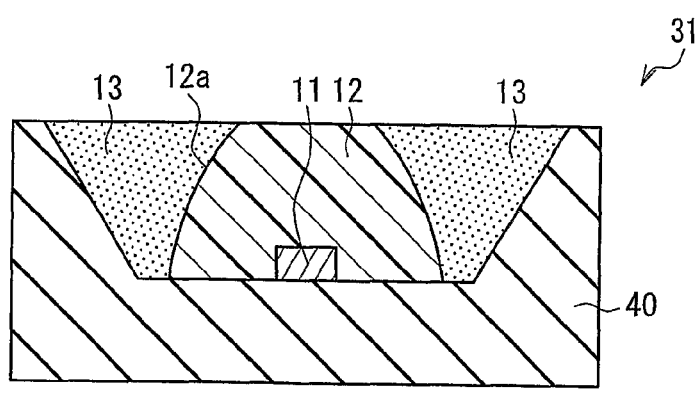
FIG. 18 is a schematic cross-sectional view of a light-emitting device of Embodiment 11 according to the present invention.
Figure 19:
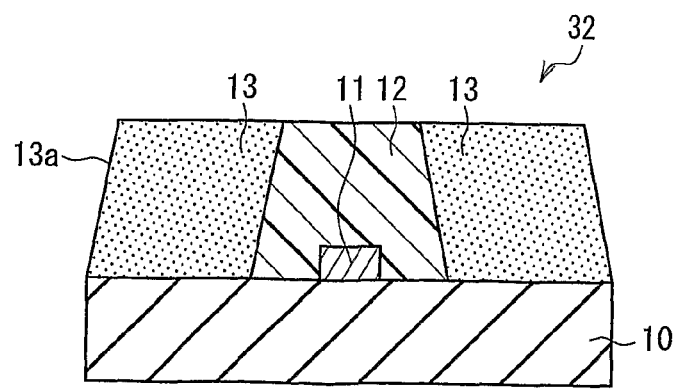
FIG. 19 is a schematic cross-sectional view of a light-emitting device of Embodiment 12 according to the present invention.

FIGS. 17, 18, and 19 respectively are schematic cross-sectional views of light-emitting devices of Embodiments 10, 11, and 12 according to the present invention.

A light-emitting device 30 shown in FIG. 17 is the same as the light-emitting device 1 (see FIG. 1) described above, except that the light-emitting device 30 includes a first sealing material layer 12 formed on a cup-shaped base 40 made of alumina, and the first sealing material layer 12 is formed so that the thickness in the horizontal direction is decreased successively in a light output direction. Furthermore, the light-emitting device 31 shown in FIG. 18 is the same as the light-emitting device 1 (see FIG. 1) described above, except that the light-emitting device 31 includes the first sealing material layer 12 formed on the cup-shaped base 40, the first sealing material layer 12 is formed so that the thickness in the horizontal direction is decreased successively in a light output direction, and a side surface 12a of the first sealing material layer 12 is formed of a curved surface. Furthermore, a light-emitting device 32 shown in FIG. 19 is the same as the light-emitting device 1 (see FIG. 1) described above, except that the light-emitting device 32 includes the first sealing material layer 12 formed on the base 10, the first sealing material layer 12 is formed so that the thickness in the horizontal direction is decreased successively in a light output direction, a side surface 13a of the second sealing material layer 13 is formed in a taper shape, and light also is output from the side surface 13a.

Figure 20A:
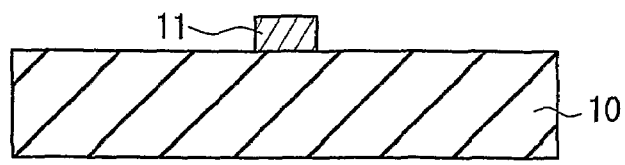
FIGS. 20A-20D are schematic cross-sectional views showing parts of production processes of the light-emitting device of Embodiment 12 according to the present invention.
Figure 20B:
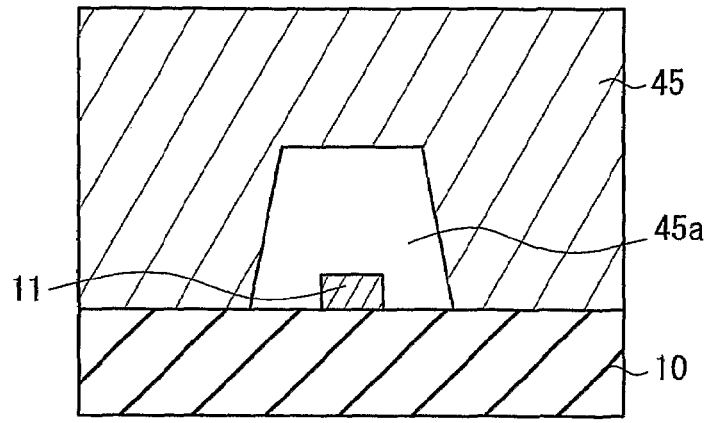
Figure 20C:
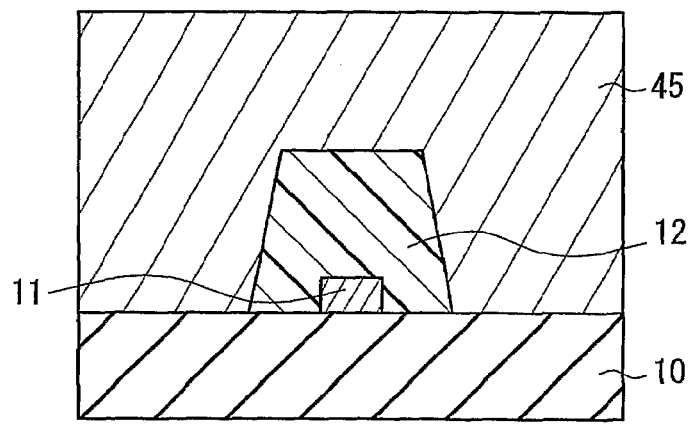
Figure 20D:
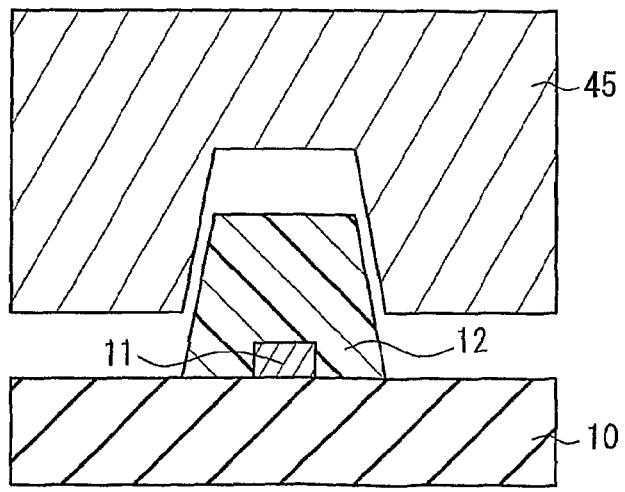

Next, a part of production processes of the light-emitting device 32 will be described. First, as shown in FIG. 20A, a light-emitting element 11 is set on a base 10. Next, as shown in FIG. 20B, a mold 45 having a concave portion 45a is placed on the base 10 so that the light-emitting element 11 is positioned in the concave portion 45a. Subsequently, as shown in FIG. 20C, the concave portion 45a is filled with a first sealing material, which then is solidified. Finally, as shown in FIG. 20D, by removing the mold 45 from the base 10, a first sealing material layer 12 is formed on the base 10 so as to cover the light-emitting element 11. The horizontal thickness of the first sealing material layer 12 is formed so as to be decreased successively in a light output direction. Therefore, it is understood that the peelability of the mold 45 is satisfactory, and the first sealing material layer 12 has a shape that is excellent in terms of productivity.

Figure 21:
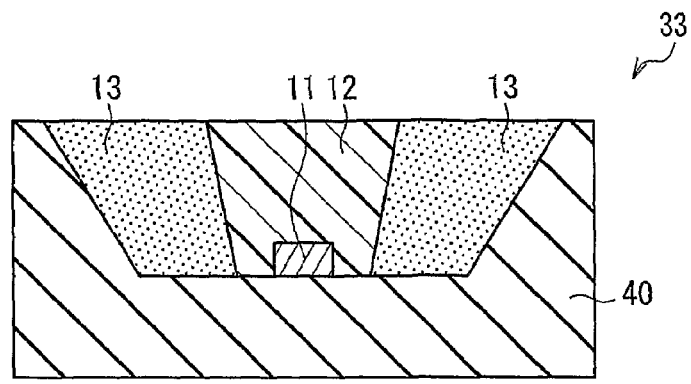
FIG. 21 is a schematic cross-sectional view of a light-emitting device of Embodiment 13 according to the present invention.
Figure 22:
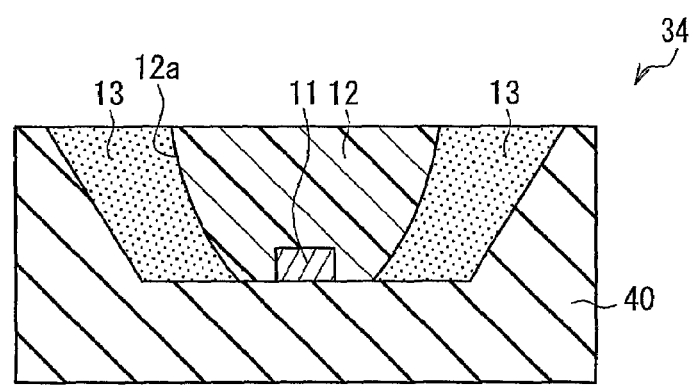
FIG. 22 is a schematic cross-sectional view of a light-emitting device of Embodiment 14 according to the present invention.
Figure 23:
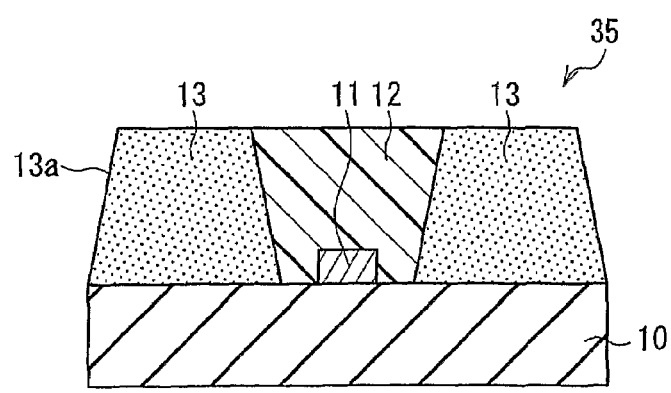
FIG. 23 is a schematic cross-sectional view of a light-emitting device of Embodiment 15 according to the present invention.

FIGS. 21, 22, and 23 are schematic cross-sectional views of light-emitting devices of Embodiments 13, 14, and 15 according to the present invention.

A light-emitting device 33 shown in FIG. 21 is the same as the light-emitting device 1 (see FIG. 1) described above, except that the light-emitting device 33 includes the first sealing material layer 12 formed on the cup-shaped base 40, and the first sealing material layer 12 is formed so that the thickness in the horizontal direction is increased successively in a light output direction. Furthermore, a light-emitting device 34 shown in FIG. 22 is the same as the light-emitting device 1 (see FIG. 1) described above, except that the light-emitting device 34 includes the first sealing material layer 12 formed on the cup-shaped base 40, and the thickness in the horizontal direction is increased successively in a light output direction, and a side surface 12a of the first sealing material layer 12 is formed of a curved surface. Furthermore, a light-emitting device 35 shown in FIG. 23 is the same as the light-emitting device 1 (see FIG. 1) described above, except that the light-emitting device 35 includes the first sealing material layer 12 formed on the base 10, the first sealing material layer 12 is formed so as to be increased successively in a light output direction, a side surface 13a of the second sealing material layer 13 is formed in a taper shape, and light also is output from the side surface 13a.

Figure 24A:
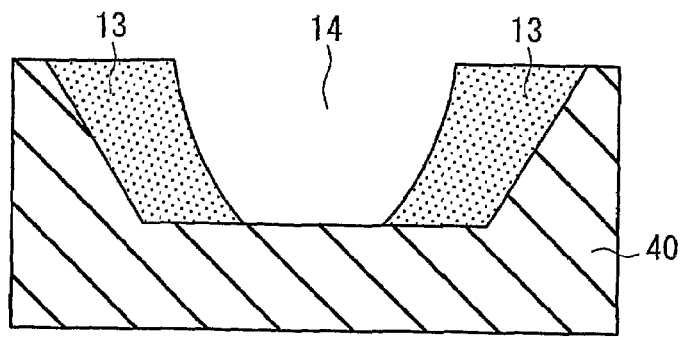
FIGS. 24A-24D are schematic cross-sectional views showing parts of production processes of the light-emitting device of Embodiment 14 according to the present invention.
Figure 24B:
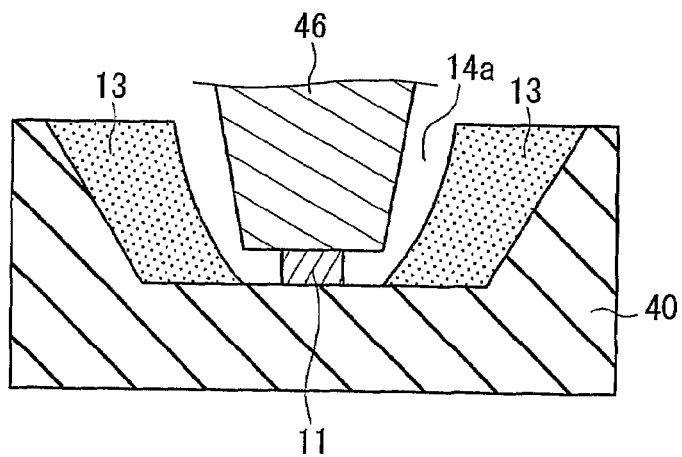
Figure 24C:
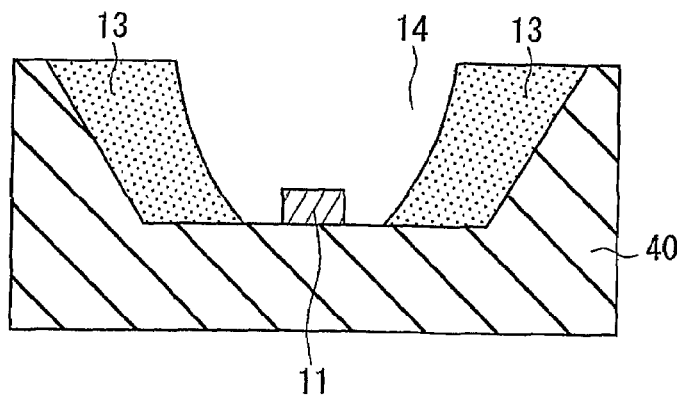
Figure 24D:
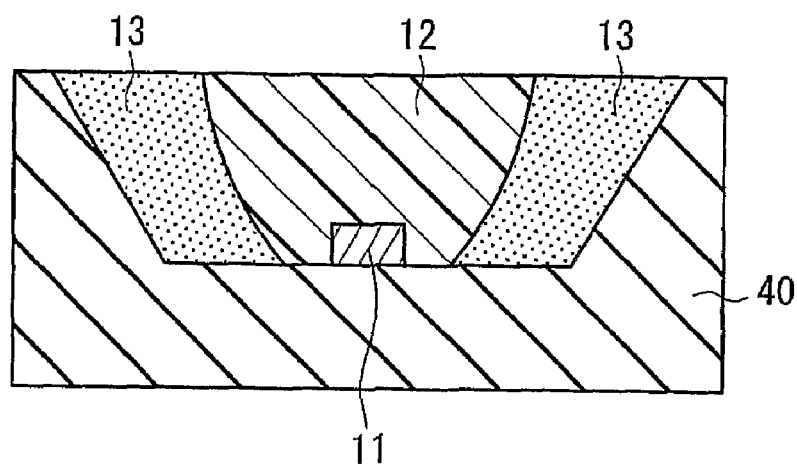

Next, a part of production processes of the light-emitting device 34 will be described. First, as shown in FIG. 24A, a second sealing material layer 13 is formed on an inside surface of a cup-shaped base 40, and a concave portion 14 is formed in a center portion of the base 40. The concave portion 14 is formed so that a size in a horizontal direction is increased successively from a lower portion to an opening. Next, as shown in FIG. 24B, a light-emitting element 11 is placed on the base 40 using a vacuum collet 46. At this time, a space 14a is formed between the vacuum collet 46 and the second sealing material layer 13, so that the vacuum collet 46 can be taken in/out easily. FIG. 24C shows a state with the vacuum collet 46 removed. Subsequently, as shown in FIG. 24D, the concave portion 14 is filled with a first sealing material, which then is solidified, whereby a first sealing material layer 12 is formed. The first sealing material layer 12 enables a jig to be taken in/out smoothly at a time of placing the light-emitting element 11 due to the configuration in which the thickness in a horizontal direction is increased successively in a light output direction. Therefore, it is understood that the first sealing material layer 12 has a shape excellent in productivity.

The present invention can be carried out in embodiments other than the above embodiments within a scope not departing from the spirit of the present invention. The embodiments disclosed in the present application are described merely for illustrative purpose, and the present invention is not limited thereto. The scope of the present invention is interpreted by placing priority on the attached claims, rather than the above description, and all the changes within the scope equivalent to that of the claims are included in the claims. In the above embodiments, in order to illustrate an essential part of the present invention, an example in which the upper surface to be a light output side of a light-emitting device is flat has been described. However, needless to say, it is possible to form a convex or concave lens, or a Fresnel lens on the upper surface.

INDUSTRIAL APPLICABILITY

A light-emitting device of the present invention is useful, for example, in an illumination device used in general illumination, illumination for performance (spotlight, a sign lamp, etc.), illumination for an automobile (in particular, a headlight), or the like, and a display apparatus used in a street large display, a projector, or the like. Furthermore, the light-emitting device of the present invention also is useful as a light source for a sensor requiring miniaturization and reduction in a thickness.

The invention claimed is:

1. A light-emitting device having a base and a light-emitting element placed on the base, comprising:
    a first sealing material layer covering the light-emitting element and a second sealing material layer surrounding a side surface of the first sealing material layer,
    wherein the first sealing material layer has a cylinder shape, and the second sealing material layer has a cylinder shape including the first sealing material layer,
    an upper surface of the first sealing material layer and an upper surface of the second sealing material layer form an identical plane,
    a side surface of the second sealing material layer is exposed,
    a refractive index of the first sealing material layer is different from that of the second sealing material layer.

2. The light-emitting device according to claim 1, wherein an optical axis of light emitted from the light-emitting element is placed at a position displaced from a center axis of the first sealing material layer in a cylinder shape and is placed at a position displaced from a center axis of the second sealing material layer in a cylinder shape.

3. A light-emitting device having a base, a light-emitting element placed on the base, and a reflective layer including an opening concave portion placed on the base,
    wherein the light-emitting element is placed on a bottom of the opening concave portion,
    the light-emitting element is covered with a first sealing material layer, a side surface of the first sealing material layer is surrounded by the second sealing material layer, and a side surface of the second sealing material layer is in contact with a wall surface in a concave of the opening concave portion,
    the first sealing material layer has a cylinder shape, and the second sealing material layer has a reverse truncated cone shape including the first sealing material layer,
    an upper surface of the first sealing material layer, an upper surface of the second sealing material layer, and an upper surface of the reflective layer form an identical plane, and
    a refractive index of the first sealing material layer is different from that of the second sealing material layer.

4. The light-emitting device according to claim 3, wherein an optical axis of light emitted from the light-emitting element is placed at a position displaced from a center axis of the first sealing material layer in a cylinder shape and is placed at a position matched with a center axis of the second sealing material layer in a reverse truncated cone shape.

5. The light-emitting device according to claim 3, wherein an optical axis of light emitted from the light-emitting element is placed at a position matched with a center axis of the first sealing material layer in a cylinder shape and is placed at a position displaced from a center axis of the second sealing material layer in a reverse truncated cone shape.

6. A light-emitting device having a base, a light-emitting element placed on the base, and a reflective layer including an opening concave portion placed on the base,
    wherein the light-emitting element is placed on a bottom of the opening concave portion,
    the light-emitting element is covered with a first sealing material layer, a side surface of the first sealing material layer is surrounded by the second sealing material layer, and a side surface of the second sealing material layer is in contact with a wall surface in a concave of the opening concave portion,
    the first sealing material layer has an elliptic cylinder shape, and the second sealing material layer has a reverse truncated cone shape including the first sealing material layer,
    an upper surface of the first sealing material layer, an upper surface of the second sealing material layer, and an upper surface of the reflective layer form an identical plane, and
    a refractive index of the first sealing material layer is different from that of the second sealing material layer.

7. The light-emitting device according to claim 1, wherein the first sealing material layer and the second sealing material layer contain no phosphor.

8. The light-emitting device according to claim 1, wherein, assuming that a refractive index of the first sealing material layer is n1 and a refractive index of the second sealing material layer is n2, a refractive index ratio n1/n2 is 0.9 or less.

9. The light-emitting device according to claim 1, wherein, assuming that a refractive index of the first sealing material layer is n1 and a refractive index of the second sealing material layer is n2, a refractive index ratio n1/n2 is 1.1 or more.

10. The light-emitting device according to claim 1, wherein the light-emitting element includes a sub-mount substrate, an LED chip formed on one principal surface side of the sub-mount substrate, and a phosphor layer covering a periphery of the LED chip.

11. The light-emitting device according to claim 1, wherein at least one of the first sealing material layer and the second sealing material layer is a metal oxide formed of metal alkoxide.

12. The light-emitting device according to claim 1, wherein at least one of the first sealing material layer and the second sealing material layer is resin or a glass material irradiated with an electron beam or an ion beam.

13. The light-emitting device according to claim 1, wherein at least one of the first sealing material layer and the second sealing material layer is a $TeO_2$—$B_2O_3$—$ZnO$-based glass material.

14. The light-emitting device according to claim 1, wherein at least one of the first sealing material layer and the second sealing material layer is a composite material in which a nanoparticle material made of a metal oxide is dispersed.

* * * * *